United States Patent
Liu et al.

(10) Patent No.: US 7,879,708 B2
(45) Date of Patent: Feb. 1, 2011

(54) APPARATUS AND ASSOCIATED METHOD FOR MAKING A FLOATING GATE CELL WITH INCREASED OVERLAY BETWEEN THE CONTROL GATE AND FLOATING GATE

(75) Inventors: Chen-Chin Liu, Hsinchu (TW); Lan Ting Huang, Kaohsiung (TW); Ling Kuey Yang, Changhua (TW); Po Hsuan Wu, Hsinchu (TW)

(73) Assignee: Macronix International Co. Ltd. (TW)

( * ) Notice: Subject to any disclaimer, the term of this patent is extended or adjusted under 35 U.S.C. 154(b) by 386 days.

(21) Appl. No.: 11/534,143

(22) Filed: Sep. 21, 2006

(65) Prior Publication Data

US 2008/0121971 A1    May 29, 2008

(51) Int. Cl.
*H01L 21/3205* (2006.01)
*H01L 21/4763* (2006.01)

(52) U.S. Cl. .............. 438/589; 438/259; 257/E21.422

(58) Field of Classification Search ............ 438/259, 438/589; 257/E21.422
See application file for complete search history.

(56) References Cited

U.S. PATENT DOCUMENTS

| | | | |
|---|---|---|---|
| 7,050,330 B2* | 5/2006 | Forbes | 365/185.03 |
| 2006/0240619 A1* | 10/2006 | Ozawa et al. | 438/257 |
| 2007/0020840 A1* | 1/2007 | Chindalore | 438/211 |
| 2007/0020845 A1* | 1/2007 | Swift et al. | 438/257 |
| 2007/0031999 A1* | 2/2007 | Ho et al. | 438/142 |

FOREIGN PATENT DOCUMENTS

| | | |
|---|---|---|
| CN | 1720618 | 1/2006 |
| CN | 1855548 | 11/2006 |

* cited by examiner

*Primary Examiner*—Matthew S Smith
*Assistant Examiner*—John M Parker
(74) *Attorney, Agent, or Firm*—Baker & McKenzie LLP

(57) ABSTRACT

A method for fabricating a floating gate memory device comprises using a buried diffusion oxide that is below the floating gate thereby producing an increased step height between the floating gate and the buried diffusion oxide. The increased step height can produce a higher GCR, while still allowing decreased cell size using a virtual ground array design.

20 Claims, 7 Drawing Sheets

APPARATUS AND ASSOCIATED METHOD FOR MAKING A FLOATING GATE CELL WITH INCREASED OVERLAY BETWEEN THE CONTROL GATE AND FLOATING GATE

BACKGROUND

1. Field of the Invention

The embodiments described herein are directed to methods for fabricating non-volatile memory devices, and more particularly to methods for fabricating floating-gate memory devices using virtual ground arrays.

2. Background of the Invention

FIG. 1 is a schematic representation of a conventional floating gate memory cell 100. Memory cell 100 comprises a substrate 102 with diffusion regions 104 and 106 formed therein. The diffusion regions correspond to the source and drain of FET-type device. According to one example, substrate 102 can be a P-type substrate and diffusion regions 104 and 106 can be N-type diffusion regions. In other embodiments, cell 100 can comprise an N-type substrate 102 with P-type diffusion regions 104 and 106. Although it will be understood that a P-type substrate is generally preferred.

Cell 100 further comprises a gate dielectric layer, sometimes referred to as a tunnel dielectric layer 108 formed over substrate 102 between diffusion regions 104 and 106. A floating gate 110 is then formed over gate dielectric 108. Floating gate 110 is typically formed from a polysilicon. An inter—polysilicon (poly) dielectric layer 112 then separates floating gate 110 from a control gate 114. Control gate 114 is also typically formed from polysilicon. Inter-poly dielectric layer 112 can be formed from, e.g., a silicon dioxide ($SiO_2$) material. In other embodiments, inter-poly dielectric 110 can comprise a multi-layer structure such as an Oxide-Nitride-Oxide (ONO) structure.

In operation, a high voltage is applied to control gate 114 in order to program cell 100. This voltage is coupled with floating gate 110 via a control gate capacitance ($C_{CG}$). The coupled voltage causes an inversion channel to be formed in the upper layer of substrate 102 between diffusion regions 104 and 106. Voltages are then applied to diffusion regions 104 and 106 so as to create a large lateral electric field that will cause carriers to flow through the channel, e.g., from one diffusion region towards the other.

The voltage coupled with floating gate 110 will create an electric field sufficient to cause some of the carriers to tunnel through gate dielectric 108 into floating gate 110. In other words, the voltage coupled with floating gate 110 needs to be capable of producing an electric field that can supply the carriers with enough energy to allow them to overcome the barrier height of gate dielectric 108. Accordingly, as mentioned above, sufficient coupling between control gate 114 and floating gate 110 is required in order to ensure that an adequate field is present to induce carriers to pass through gate dielectric 108 onto floating gate 110.

It is well known to use virtual ground array designs in order to reduce the cell size for floating gate memory cells and non-volatile memory products, such as flash memory products. Smaller cell sizes, however, often require smaller buried diffusion sizes, which are not necessarily compatible with conventional processing techniques.

For example, one problem that can occur as a result of the reduced buried diffusion sizes with conventional fabrication techniques is a reduced gate coupling ratio (GCR) between the control gate and floating gate. Sufficient coupling is needed in order to ensure that an adequate field is present in the memory cell to induce carriers to pass through the tunnel oxide layer into the floating gate.

As is understood, the GCR is a function of the $C_{GC}$ as well as the Source Capacitance ($C_S$), Bulk Capacitance ($C_B$), and Drain Capacitance ($C_D$) illustrated in FIG. 1. The relationship is defined as:

$$GCR=C_{CG}/(C_S+C_B+C_D+C_{CG})$$

Accordingly, the GCR can be increased by increasing $C_{CG}$, or by decreasing the Source Capacitance ($C_S$) or Drain Capacitance ($C_D$). Thus, by increasing the distance between floating gate 110 and buried diffusion regions 104 and 106, source and drain capacitances ($C_S$, $C_D$) can be decreased. As a result, the gate coupling ratio (GCR) of the memory device can be improved. Accordingly, it is important to maintain adequate GCR in virtual ground arrays, despite the smaller buried diffusion sizes.

SUMMARY

A method for fabricating a floating gate memory device comprises using a buried diffusion oxide that is below the floating gate thereby producing an increased step height between the floating gate and the buried diffusion oxide. The increased step height can produce a higher GCR, while still allowing decreased cell size using a virtual ground array design.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

In the methods described below, an increased GCR in a scaled virtual ground cell is provided by fabricating the cell in order to produce a large step height between the floating gate and the buried diffusion oxide. As a result, a larger overlay region can be maintained between the control gate and floating gate, which increases the GCR.

Figure 1:
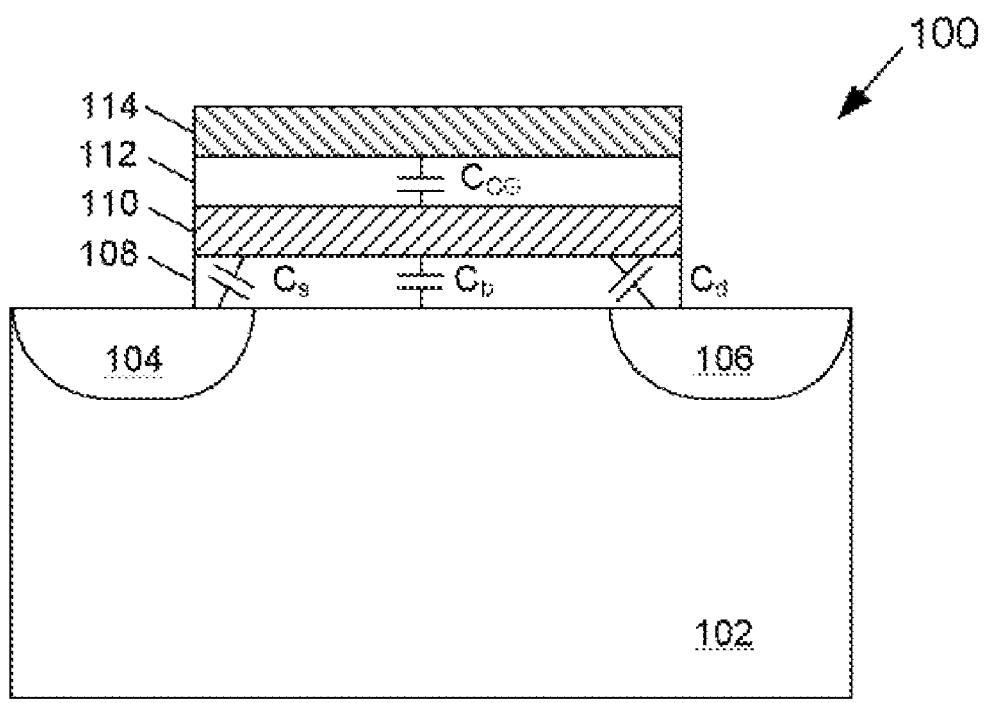
FIG. 1 is a schematic diagram illustrating a cross-sectional view of a conventional floating gate memory cell.
Figure 2:
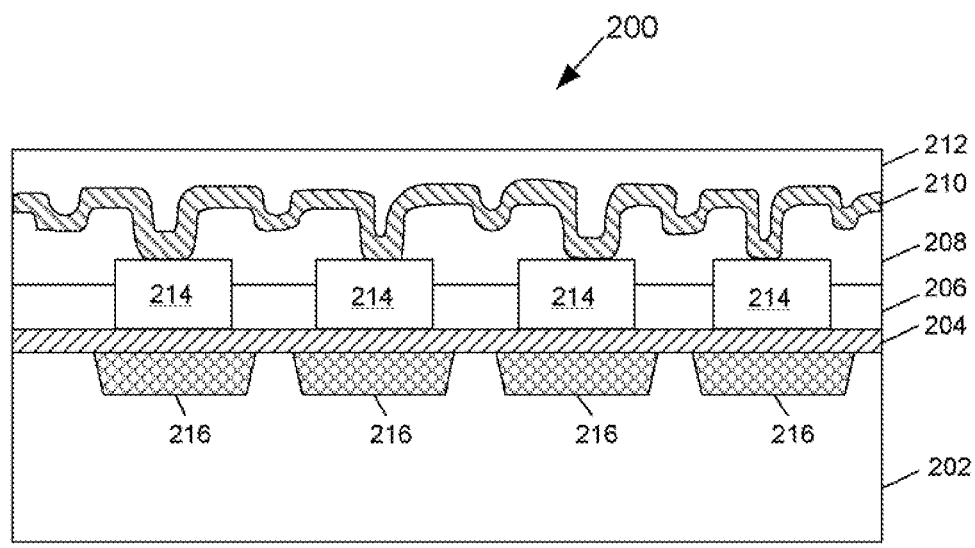
FIG. 2 is a schematic diagram illustrating a cross-sectional view of a floating gate memory device fabricated using a conventional fabrication process.

FIG. 2 is a schematic diagram illustrating a cross-sectional view of a conventional floating gate memory device fabricated using a conventional process. As can be seen, device 200 comprises a substrate 202 with diffusion regions 216 implanted therein. A dielectric layer 204 (i.e., a tunnel oxide layer) is formed on substrate 202. Floating gates for the various cells in device 200 are then formed from polysilicon layers 206 and 208. These layers can be referred to as the first and fourth poly layers respectively. Buried diffusion oxides 214 are formed over diffusion region 216 and Oxide-Nitride-Oxide (ONO) layer 210, i.e., an inter-poly dielectric, is then formed over fourth poly layer 208. It will be understood that buried diffusion oxides 214 correspond with buried diffusion lines that run through the array.

Figure 3:
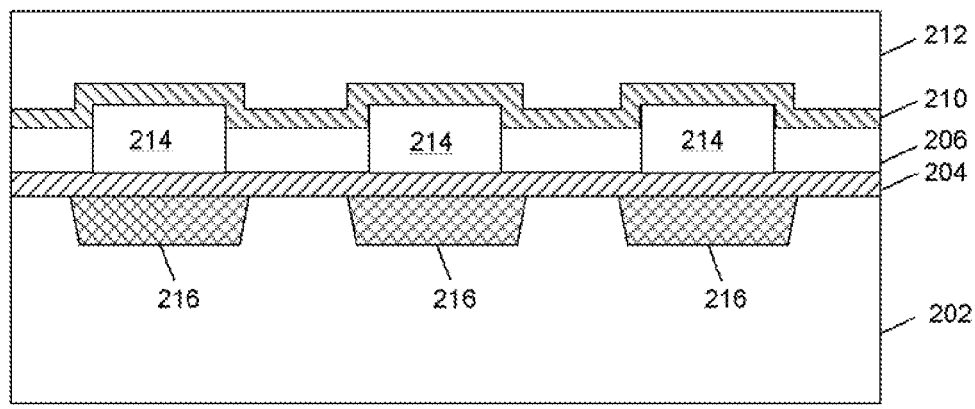
FIG. 3 is a schematic diagram illustrating a cross-sectional view of a floating gate memory device fabricated using a conventional fabrication process that does not include a fourth poly step.

A control gate polysilicon layer 212, i.e., the second poly layer, is then formed on ONO layer 210. As mentioned, as buried diffusion regions 216 decrease in size, the coupling between the control gate and the floating gate is reduced. FIG. 3 is a diagram illustrating a floating gate memory device constructed using a conventional process that does not include fourth poly layer 208; however, it can be shown that simply eliminating fourth poly layer 208 is not sufficient to provide adequate GCR to make an effective memory device.

Figure 4:
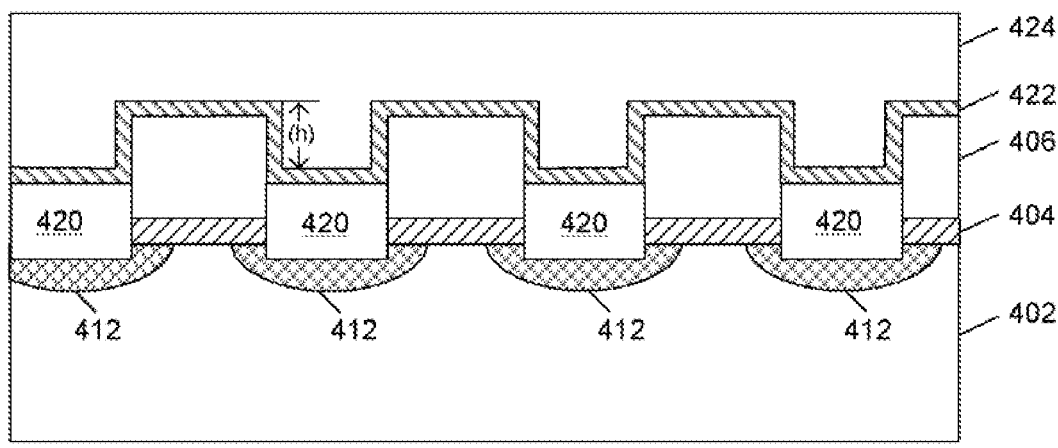
FIG. 4 is a schematic diagram illustrating a cross-sectional view of a floating gate memory cell fabricated in accordance with one embodiment.

Accordingly, FIG. 4 is a diagram illustrating a floating gate memory device 400 fabricated in accordance with the embodiments described herein. As can be seen, device 400 comprises buried diffusion oxides 420, wherein the step height (h) between the top of ONO layer 422 above floating gate layer 406 and the top of ONO layer 422 above buried diffusion oxide 420 is larger than in FIGS. 2 and 3 where the top of floating gate 206 is below the top of buried diffusion oxide 214. In FIG. 4, polysilicon layer 424, i.e., the second poly layer, overlays ONO layer 422, i.e., the inter-poly dielectric, which is formed on top of floating gates 406. The increased step height (h) produces a greater GCR due to the larger overlay between the control gate and floating gate that can then be achieved.

It should be noted that while an ONO layer 422 is illustrated in the example of FIG. 4, layer 422 can be seen as simply a dielectric layer. Accordingly, the example of FIG. 4 should not be seen as limiting the devices and methods described herein to the use of a particular type of dielectric layer, e.g., an ONO layer 422, and it will be understood that any suitable dielectric layer can be used.

FIGS. 5A-5G are diagrams illustrating an exemplary process for fabricating a device 400 in accordance with one embodiment. First, in FIG. 5A, a dielectric layer 504, i.e., tunnel oxide, is formed on substrate 502. For example, dielectric layer 504 may comprise silicon dioxide ($SiO_2$). After this, a first poly layer 506 is deposited. First poly layer 506 can be anywhere from approximately 600 Å to 1400 Å. A silicon nitride layer 508 can then be deposited on first poly layer 506.

Figure 5A:
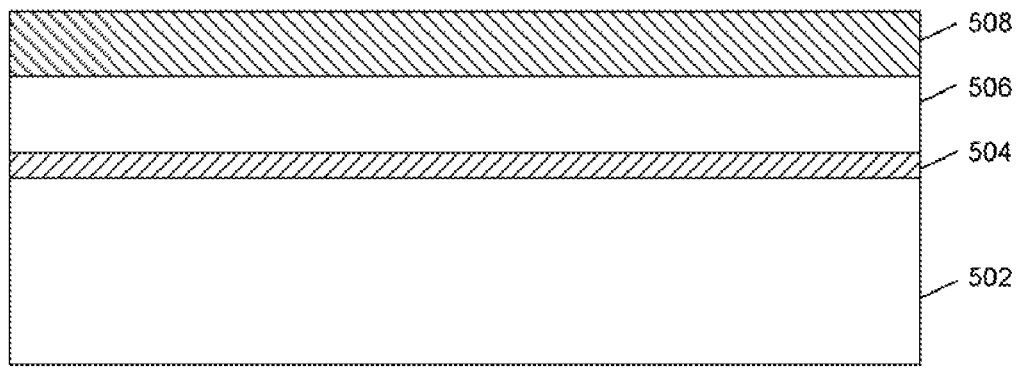
FIGS. 5A-5G are schematic diagrams illustrating an exemplary process for fabricating the floating gate memory device of FIG. 4 in accordance with one embodiment.
Figure 5B:
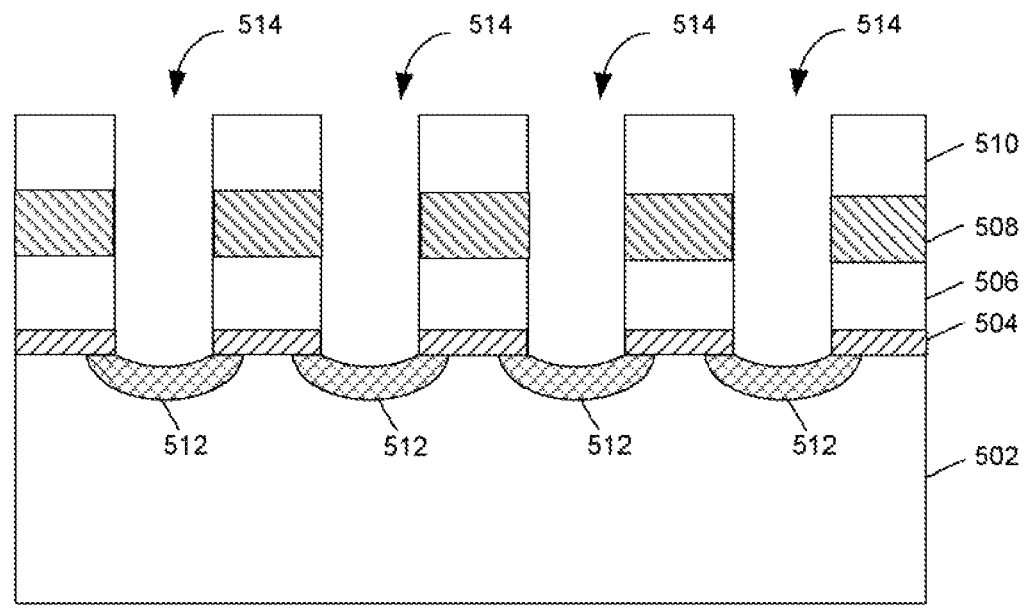

As illustrated in FIG. 5B, a photoresist 510 can then be used to pattern silicon nitride layer 508, first poly layer 506, and dielectric layer 504. Patterned layers 506, 508, and 504 can then be etched as illustrated in FIG. 5B. The etching process should produce a slight recess in substrate 502 at the bottom of etched regions 514 created during the etching process. Thus, for example, the etching process can be similar to that used for Shallow Trench Isolation (STI) structure formation; however, it will be understood that the recesses created will be more shallow than the trenches produced in STI formation.

Diffusion regions 512 can then be implanted and heat driven in substrate 502. For example, if substrate 502 is a P-type substrate, then N+ diffusion regions 512 can be implanted in the P-type substrate 502. Since silicon nitride layer 508 and first poly layer 506 act as an implant mask, this process is self-aligned.

Figure 5C:
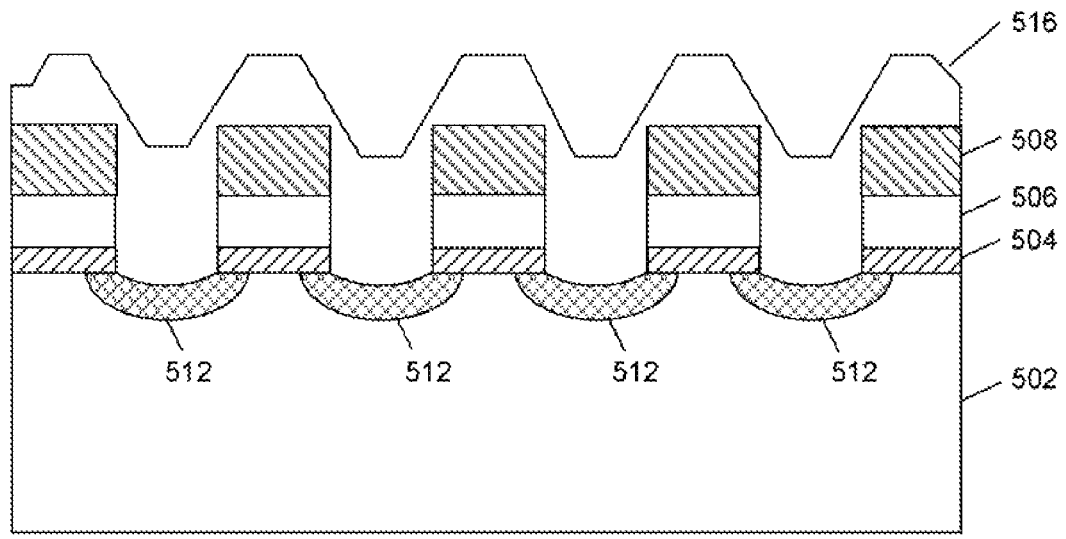
Figure 5D:
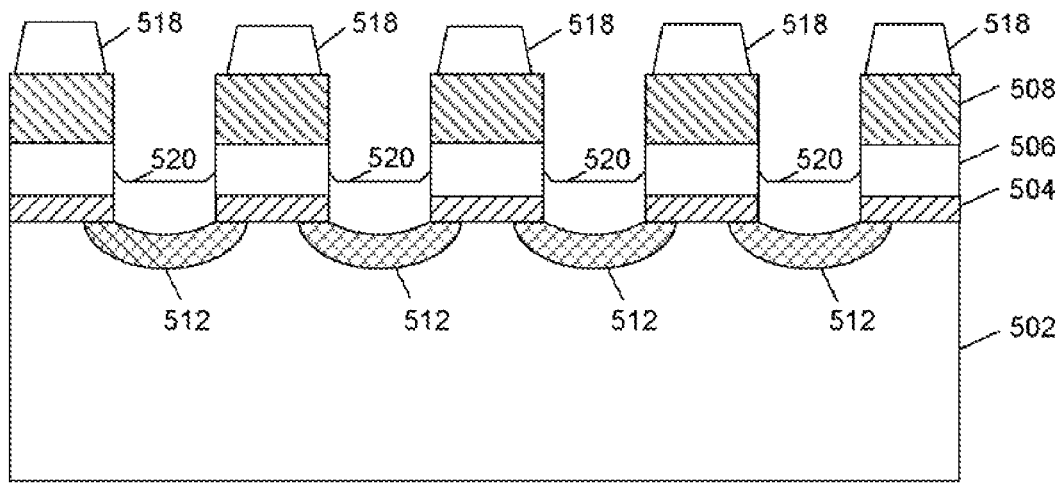

Referring to FIG. 5C, a dielectric layer 516 is then formed over substrate 502 as illustrated. Dielectric layer 516 can be, for example, a $SiO_2$ layer and can be formed using High Density Plasma (HDP)—CVD. Referring to FIG. 5D, a portion of dielectric layer 516 is removed to expose the remaining portions of silicon nitride layer 508 and part of the remaining portions of polysilicon layer 506. For example, a conventional wet etching, such as HF or BOE solution (i.e., isotropic), process can be used to remove a portion of dielectric layer 516. Removing the right amount of dielectric layer 516 can be achieved by having a high etching selectivity ratio between dielectric layer 516 and silicon nitride layer 508.

The etching process also produces oxide regions 520, which can form the buried diffusion oxides for the device.

Figure 5E:
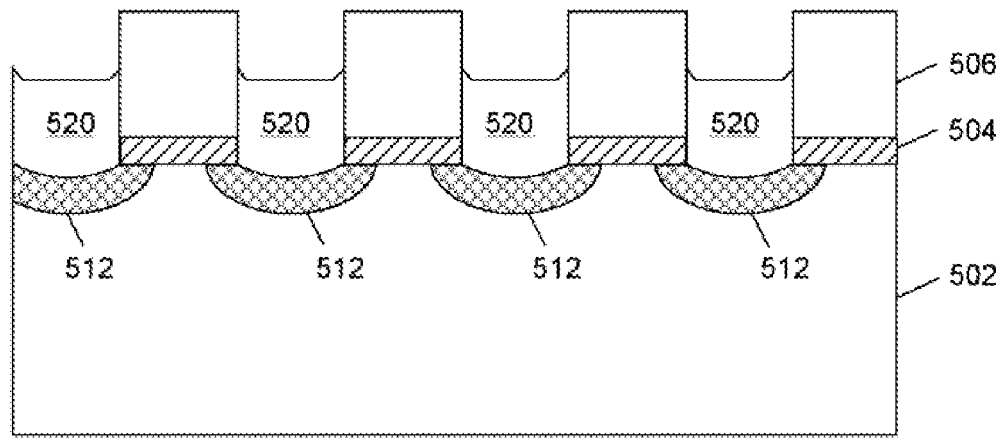

Referring to FIG. 5E, the remaining portions of silicon nitride layer 508 can then be removed, removing portions 518 of dielectric layer 516 in the process. For example, hot phosphoric acid can be used to remove the remaining portions of silicon nitride layer 508. Portions 518 of dielectric layer 516 will automatically be removed during the removal of the remaining portions of silicon nitride layer 508 because portions 518 are disconnected from the rest of dielectric layer 516.

Figure 5F:
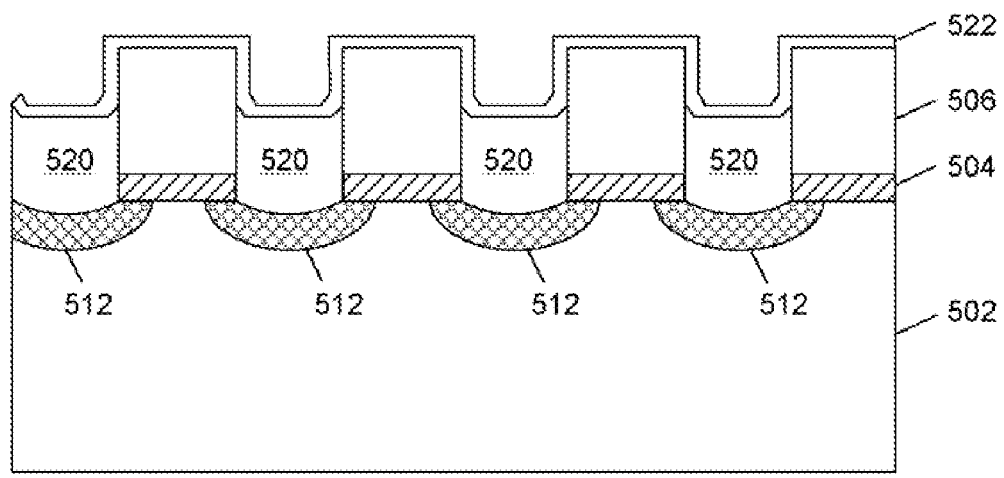

ONO layer 522 can then be formed over substrate 502 as illustrated in FIG. 5F. It will be understood that formation of an ONO layer 522 comprises the deposition/formation of a plurality of layers in sequence. These layers typically comprise an oxide layer, a nitride layer, such as a silicon nitride layer (SiN), and another oxide layer. Although, as mentioned above, certain embodiments can make use of an alternative inter-dielectric layer, in which case formation of layer 522 comprises formation of the alternative inter-dielectric material.

Figure 5G:
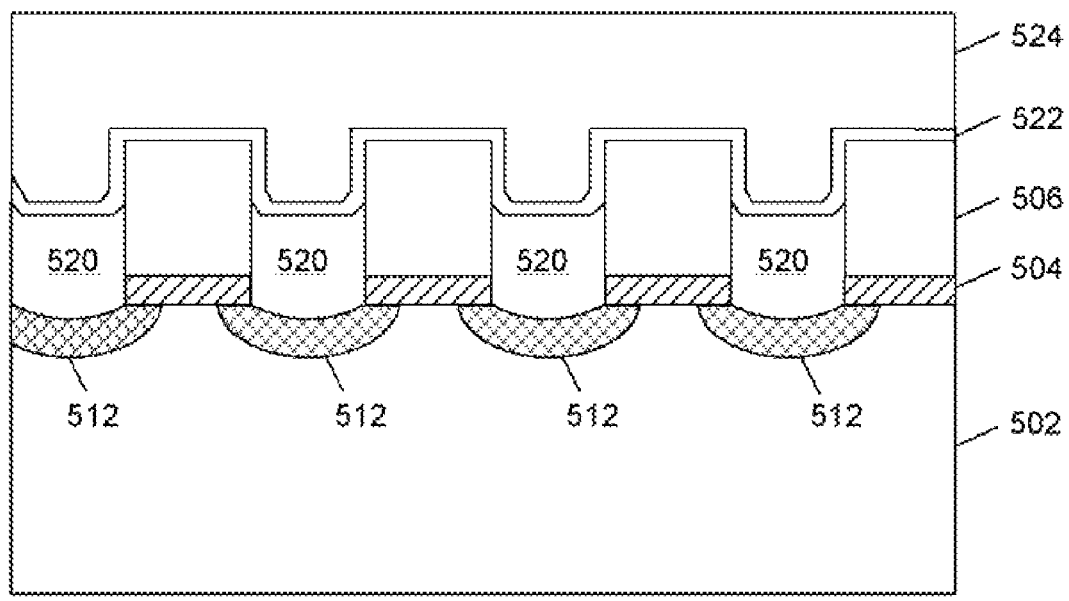

A polysilicon layer 524 can then be formed over ONO layer 522 as illustrated in FIG. 5G. Polysilicon layer 524 is the second poly layer and can be formed, e.g., using CVD.

Device processing can continue in accordance with conventional process techniques after the steps illustrated in FIG. 5G. These steps can include the patterning and etching of the second poly layer, formation of a third poly layer, and patterning and etching of the third poly layer. Conventional Back End of the Line (BEOL) processing techniques can then be used to form the required metal interconnect layers.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A floating gate memory device, comprising:
   a substrate comprising a buried diffusion region and a shallow recess within the buried diffusion region;
   a first dielectric layer formed directly on at least a portion of the buried diffusion region;
   a buried diffusion oxide formed in the shallow recess adjacent to the first dielectric layer;
   a floating gate formed directly on the first dielectric layer and not on the buried diffusion oxide, wherein the top of the floating gate is higher than the top of the buried diffusion oxide and the bottom of the floating gate is higher than the top of the buried diffusion region; and
   a second dielectric layer formed over the floating gate and the buried diffusion oxide.

2. The floating gate memory device of claim 1, further comprising a control gate formed over the floating gate and the second dielectric layer.

3. The floating gate memory device of claim 2, wherein the floating gate and control gate are formed from patterned polysilicon layers.

4. The floating gate memory device of claim 1, wherein the floating gate has a thickness in the range of approximately 600 Å to 1400 Å.

5. The floating gate memory device of claim 1, further comprising an increased step height between the top of the second dielectric layer above the floating gate and the top of the second dielectric layer above the buried diffusion oxide.

6. The floating gate memory device of claim 5, wherein the step height between the top of the second dielectric layer above the floating gate and the top of the second dielectric layer above the buried diffusion oxide is in the range of approximately 300 Å to 800 Å.

7. The floating gate memory device of claim 1, wherein the second dielectric layer is an oxide-nitride-oxide (ONO) dielectric layer.

8. The floating gate memory device of claim 1, wherein the top of the buried diffusion oxide is higher than the top of the first dielectric layer.

9. A floating gate memory device, comprising:
a substrate comprising first and second buried diffusion regions and corresponding first and second shallow recesses within the first and second buried diffusion regions;
a first dielectric layer formed directly on at least a portion of both the first and second buried diffusion regions;
first and second buried diffusion oxides formed in the corresponding first and second shallow recesses adjacent to and on opposing ends of the first dielectric layer;
a floating gate formed directly on the first dielectric layer and not on the first and second buried diffusion oxides, wherein the top of the floating gate is higher than the top of the first and second buried diffusion oxides and the bottom of the floating gate is higher than the top of the first and second buried diffusion regions; and
a second dielectric layer formed over the floating gate and the first and second buried diffusion oxides.

10. The floating gate memory device of claim 9, further comprising a control gate formed over the floating gate and the second dielectric layer.

11. The floating gate memory device of claim 10, wherein the floating gate and control gate are formed from patterned polysilicon layers.

12. The floating gate memory device of claim 9, wherein the floating gate has a thickness in the range of approximately 600 Å to 1400 Å.

13. The floating gate memory device of claim 9, further comprising an increased step height between the top of the second dielectric layer above the floating gate and the top of the second dielectric layer above the first and second buried diffusion oxides.

14. The floating gate memory device of claim 13, wherein the step height between the top of the second dielectric layer above the floating gate and the top of the second dielectric layer above the first and second buried diffusion oxide is in the range of approximately 300 Å to 800 Å.

15. The floating gate memory device of claim 9, wherein the second dielectric layer is an oxide-nitride-oxide (ONO) dielectric layer.

16. The floating gate memory device of claim 9, wherein the tops of the first and second buried diffusion oxides are higher than the top of the first dielectric layer.

17. A floating gate memory device, comprising:
a substrate comprising a buried diffusion region and a shallow recess within the buried diffusion region;
a first dielectric layer formed directly on at least a portion of the buried diffusion region;
a buried diffusion oxide formed in the shallow recess adjacent to the first dielectric layer, wherein the top of the buried diffusion oxide is higher than the top of the first dielectric layer;
a floating gate formed directly on the first dielectric layer and not on the buried diffusion oxide, wherein the top of the floating gate is higher than the top of the buried diffusion oxide and the bottom of the floating gate is higher than the top of the buried diffusion region;
a second dielectric layer formed over the floating gate and the buried diffusion oxide; and
a control gate formed on the second dielectric layer, over the floating gate and the second dielectric layer.

18. The floating gate memory device of claim 17, wherein the floating gate and control gate are formed from patterned polysilicon layers.

19. The floating gate memory device of claim 17, further comprising an increased step height between the top of the second dielectric layer above the floating gate and the top of the second dielectric layer above the buried diffusion oxide.

20. The floating gate memory device of claim 17, wherein the second dielectric layer is an oxide-nitride-oxide (ONO) dielectric layer.

* * * * *